(12) United States Patent (10) Patent No.: US 12,094,929 B2
Gong et al. (45) Date of Patent: Sep. 17, 2024

(54) SEMICONDUCTOR POWER DEVICE

(71) Applicant: SUZHOU ORIENTAL SEMICONDUCTOR CO., LTD., Jiangsu (CN)

(72) Inventors: Yi Gong, Jiangsu (CN); Wei Liu, Jiangsu (CN); Zhendong Mao, Jiangsu (CN); Zhenyi Xu, Jiangsu (CN)

(73) Assignee: SUZHOU ORIENTAL SEMICONDUCTOR CO., LTD., Jiangsu (CN)

( * ) Notice: Subject to any disclaimer, the term of this patent is extended or adjusted under 35 U.S.C. 154(b) by 18 days.

(21) Appl. No.: 17/440,557

(22) PCT Filed: Sep. 28, 2020

(86) PCT No.: PCT/CN2020/118240
§ 371 (c)(1),
(2) Date: Sep. 17, 2021

(87) PCT Pub. No.: WO2022/021593
PCT Pub. Date: Feb. 3, 2022

(65) Prior Publication Data
US 2023/0154981 A1   May 18, 2023

(30) Foreign Application Priority Data
Jul. 31, 2020 (CN) .......................... 202010763267.1

(51) Int. Cl.
*H01L 29/06* (2006.01)
*H01L 29/40* (2006.01)
*H01L 29/78* (2006.01)

(52) U.S. Cl.
CPC ........ *H01L 29/0661* (2013.01); *H01L 29/063* (2013.01); *H01L 29/407* (2013.01); *H01L 29/7813* (2013.01)

(58) Field of Classification Search
CPC ............... H01L 29/407; H01L 29/7813; H01L 29/0696; H01L 29/1095; H01L 29/0661; H01L 29/063; H01L 29/0623
See application file for complete search history.

(56) References Cited

FOREIGN PATENT DOCUMENTS

CN   104465656 A      3/2015
CN   105280640 A *    1/2016   ......... H01L 29/0623
(Continued)

OTHER PUBLICATIONS

PCT/CN2020/118240 International Search Report dated Mar. 15, 2021.

*Primary Examiner* — Victor A Mandala
*Assistant Examiner* — Lawrence C Tynes, Jr.
(74) *Attorney, Agent, or Firm* — Michael Best & Friedrich LLP

(57) ABSTRACT

The present application belongs to the technical field of semiconductor power devices and provides a semiconductor power device. The semiconductor power device includes an n-shaped substrate, an n-shaped epitaxial layer positioned on the n-shaped substrate, and at least three grooves recessed inside the n-shaped epitaxial layer, where a portion of the n-shaped epitaxial layer between two adjacent grooves of the at least three grooves is a mesa structure, an upper part of the mesa structure is provided with a p-shaped body region, and an n-shaped source region is provided inside the p-shaped body region. The mesa structure includes at least one mesa structure with a lower width being a first width and at least one mesa structure with a lower width being a second width, and the second width is greater than the first width.

7 Claims, 1 Drawing Sheet

(56) References Cited

FOREIGN PATENT DOCUMENTS

| | | | |
|---|---|---|---|
| DE | 10214151 B4 | | 4/2007 |
| JP | 2017098403 A | * | 6/2017 |
| JP | 6536377 B2 | | 7/2019 |

* cited by examiner

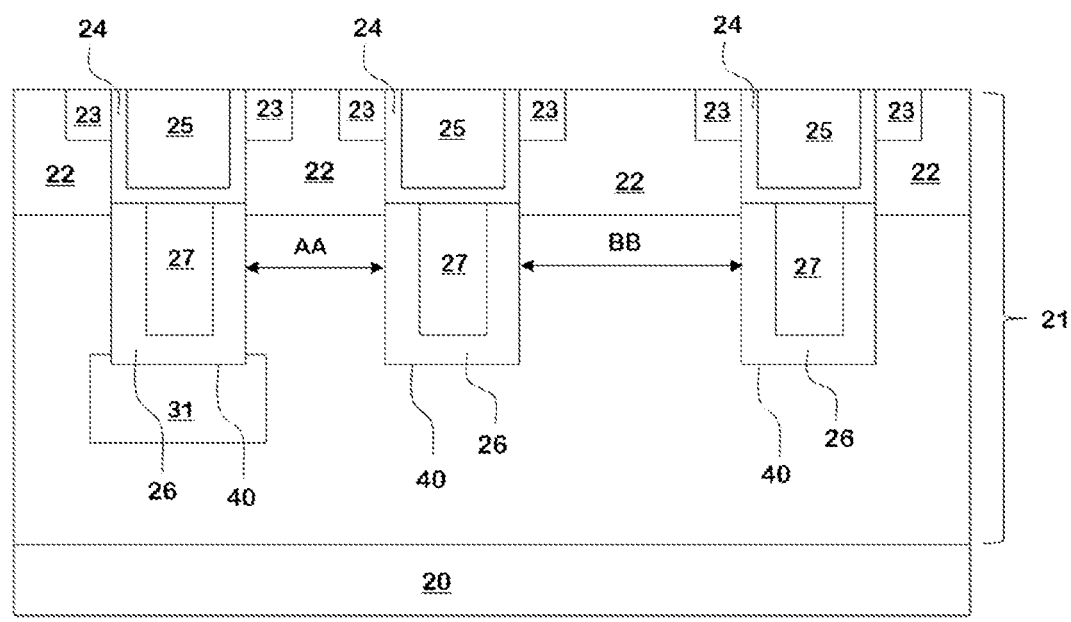

SEMICONDUCTOR POWER DEVICE

This is a National Stage Application filed under 35 U.S.C. 371 based on International Patent Application No. PCT/CN2020/118240, filed on Sep. 28, 2020, which claims priority to Chinese Patent Application No. 202010763267.1 filed on Jul. 31, 2020, disclosures of both of which are incorporated herein by reference in their entireties.

TECHNICAL FIELD

The present application belongs to the technical field of semiconductor power devices, for example, a semiconductor power device with a slow-varying capacitance.

BACKGROUND

A semiconductor power device includes an n-shaped substrate, an n-shaped epitaxial layer located on the n-shaped substrate, a plurality of grooves recessed inside the n-shaped epitaxial layer, and a mesa structure of the semiconductor power device that is a portion of the n-shaped epitaxial layer between each two adjacent grooves. All mesa structures of semiconductor power devices in the related art have the same width. When the semiconductor power device is turned on or off, the mesa structure may be simultaneously exhausted and pinched off at the same voltage, which generates very serious voltage oscillation.

SUMMARY

The present application provides a semiconductor power device to avoid serious voltage oscillation when the semiconductor power device in the related art is turned on or off.

The present application provides a semiconductor power device. The semiconductor power device includes an n-shaped substrate, an n-shaped epitaxial layer positioned on the n-shaped substrate, and at least three grooves recessed inside the n-shaped epitaxial layer, where a portion of the n-shaped epitaxial layer between two adjacent grooves of the at least three grooves is a mesa structure, an upper part of the mesa structure is provided with a p-shaped body region, and an n-shaped source region is provided inside the p-shaped body region. The mesa structure includes at least one mesa structure with a lower width being a first width and at least one mesa structure with a lower width being a second width, and the second width is greater than the first width.

BRIEF DESCRIPTION OF DRAWINGS

FIG. 1 is a section diagram in an embodiment of a semiconductor power device according to the present application.

DETAILED DESCRIPTION

The solution of the present application is described hereinafter through specific implementations in conjunction with the drawings in the embodiments of the present application. Apparently, the described embodiments are part, not all, of embodiments of the present disclosure. It is to be understood that the terms used in the present application such as "provided", "comprising" and "including" do not exclude the presence or addition of one or more other components or other combinations. Meanwhile, to illustrate the embodiments of the present application more clearly, in the schematic diagrams illustrated in the drawings of the Description, the sizes of layers and regions described in the present application are enlarged, and the sizes illustrated in the drawings do not represent the actual sizes.

FIG. 1 is a section diagram in an embodiment of a semiconductor power device according to the present application. As shown in FIG. 1, the semiconductor power device includes an n-shaped substrate 20 which is disposed to form an n-shaped drain region of the semiconductor power device. An n-shaped epitaxial layer 21 is positioned on the n-shaped substrate 20 and at least three grooves 40 are recessed inside the n-shaped epitaxial layer 21. Only three groove 40 structures are illustrated in the embodiment shown in FIG. 1 of the present application.

A portion of the n-shaped epitaxial layer between each two adjacent grooves 40 is a mesa structure of the semiconductor power device. An upper part of the mesa structure is provided with a p-shaped body region 22 and an n-shaped source region 23 is provided inside the p-shaped body region 22. The mesa structure of the semiconductor power device of the present application includes at least one mesa structure with a lower width being a first width AA and at least one mesa structure with a lower width being a second width BB. The second width BB is greater than the first width AA. Thus, the semiconductor power device of the present application is ensured to have a slow-varying capacitance. When the semiconductor power device of the present application is turned on or off, with the increase of voltage, the mesa structure with a smaller lower width is exhausted and pinched off first and then the mesa structure with a larger lower width is exhausted and pinched off, which may reduce voltage oscillation when the semiconductor power device is turned on or off.

It is to be noted that only three groove 40 structures, a mesa structure with a lower width being a first width AA and a mesa structure with a lower width being a second width BB are illustrated in the embodiment shown in FIG. 1 of the present application. It is to be understood that the semiconductor power device of the present application may also include more groove structures and more mesa structures. For example, the semiconductor power device of the present application may also include a mesa structure (not shown in the figure) with a lower width is an N-th width. N>2 and N is an integer and the N-th width may be different from the first width and the second width. In this manner, a slow-varying degree of the capacitance may be adjusted to reduce voltage oscillation when the semiconductor power device is turned on or off.

In an embodiment, the number of the mesa structures with the lower width being the second width BB is greater than the number of the mesa structures with the lower width being the first width AA. In this manner, the slow-varying degree of the capacitance can be adjusted to ensure a slower-varying of the capacitance of the semiconductor power device and to reduce voltage oscillation when the semiconductor power device is turned on or off.

For two grooves 40 located on two sides of the mesa structure with the lower width being the first width AA, a bottom of at least one groove is provided with an n-shaped injection region positioned inside the n-shaped epitaxial layer 21. Only a structure in which the n-shaped injection region 31 is formed inside the n-shaped epitaxial layer 21 at the bottom of the groove 40 located on the left side of the mesa structure with the lower width being the first width AA is illustrated in the embodiment shown in FIG. 1 of the present application. In this manner, the slow-varying degree of the capacitance can be adjusted to ensure a slower-varying of the capacitance of the semiconductor power device and to reduce voltage oscillation when the semiconductor power device is turned on or off.

A gate 25 is disposed inside a groove 40 and is isolated from the n-shaped epitaxial layer 21 through a gate oxide 24. The gate 25 usually controls the opening and closing of a current channel positioned inside the p-shaped body region 22 through a gate voltage. Conductive polysilicon 27 is also disposed inside the groove 40 and is isolated from the n-shaped epitaxial layer 21 through an insulating dielectric layer 26. The conductive polysilicon 27 is isolated from the gate 25 through the gate oxide 24 and is usually connected to a source voltage externally.

In the embodiment shown in FIG. 1, the gate 25 is located at an upper part of the groove 40 and the conductive polysilicon 27 is located at a lower part of each groove 40, so the semiconductor power device of the present application is a semiconductor power device with an upper-lower gate structure.

In an embodiment, the gate may be located at an upper part of the groove and conductive polysilicon is located at a lower part of the groove and extends upward into the upper part of the groove, so the semiconductor power device of the present application is a semiconductor power device with a left-right gate structure. Meanwhile, in the semiconductor power device with a left-right gate structure, the conductive polysilicon may be isolated from the gate through a gate oxide or an insulating dielectric layer, which is not limited in the embodiment of the present application.

Exemplarily, in the semiconductor power device with a left-right gate structure, a width of an upper part of a groove may be greater than a width of a lower part of the groove, which is not shown in the embodiment of the present application. It is to be noted that in the semiconductor power device with an upper-lower gate structure, a width of an upper part of a groove may also be greater than a width of a lower part of the groove, which is not shown in the embodiment of the present application.

The semiconductor power device of the present application has at least two kinds of mesa structures with different lower width. That is, the semiconductor power device of the present application has a slow-varying capacitance. When the semiconductor power device is turned on or off, with the increase of voltage, the mesa structure with a smaller lower width is exhausted and pinched off first and then the mesa structure with a larger lower width is exhausted and pinched off, which may reduce voltage oscillation when the semiconductor power device is turned on or off. Meanwhile, a slow-varying degree of the capacitance may be adjusted through forming n-shaped injection regions inside the n-shaped epitaxial layer at the bottoms of the grooves located on two sides of the mesa structure with a smaller lower width so as to reduce voltage oscillation when the semiconductor power device is turned on or off.

What is claimed is:

1. A semiconductor power device, comprising:
   an n-shaped substrate;
   an n-shaped epitaxial layer located on the n-shaped substrate; and
   at least three grooves recessed inside the n-shaped epitaxial layer;
   wherein a portion of the n-shaped epitaxial layer between two adjacent grooves of the at least three grooves is a mesa structure, an upper part of the mesa structure is provided with a p-shaped body region, and an n-shaped source region is provided inside the p-shaped body region; and
   wherein the mesa structure comprises at least one mesa structure with a lower width being a first width and at least one mesa structure with a lower width being a second width, and wherein the second width is greater than the first width;
   wherein a bottom of at least one of grooves located on two sides of a mesa structure with a lower width being the first width is provided with an n-shaped injection region located inside the n-shaped epitaxial layer;
   wherein a bottom of at least one of grooves located on two sides of a mesa structure with a lower width being the second width is provided with no n-shaped injection region located inside the n-shaped epitaxial layer.

2. The device of claim 1, wherein a number of mesa structures with a lower width being the second width is greater than a number of mesa structures with a lower width being the first width.

3. The device of claim 1, wherein a gate is disposed inside each groove of the at least three grooves, wherein the gate is isolated from the n-shaped epitaxial layer through a gate oxide.

4. The device of claim 3, wherein conductive polysilicon is disposed inside the each groove, wherein the conductive polysilicon is isolated from the n-shaped epitaxial layer and the gate through an insulating dielectric layer.

5. The device of claim 4, wherein the gate is located at an upper part of the each groove, and the conductive polysilicon is located at a lower part of the each groove.

6. The device of claim 4, wherein the gate is located at an upper part of the each groove and the conductive polysilicon is located at a lower part of the each groove and extends upward into the upper part of the each groove.

7. The device of claim 1, wherein a width of an upper part of each groove of the at least three grooves is greater than a width of a lower part of the each groove.

* * * * *